United States Patent [19]

Naito

[11] Patent Number: 5,552,964
[45] Date of Patent: Sep. 3, 1996

[54] SWITCH MOUNTED ON CIRCUIT BOARD AND METHOD OF MOUNTING SWITCH ON CIRCUIT BOARD

[75] Inventor: Hayato Naito, Nagano, Japan

[73] Assignee: Kabushiki Kaisha Sankyo Seiki Seisakusho, Nagano, Japan

[21] Appl. No.: 982,965

[22] Filed: Nov. 30, 1992

[30] Foreign Application Priority Data

Nov. 29, 1991 [JP] Japan .................................. 3-341891

[51] Int. Cl.⁶ .................. H05K 7/02; H01H 9/20
[52] U.S. Cl. .................. 361/781; 200/16 A; 200/16 R; 200/292; 200/243; 361/779
[58] Field of Search .................. 200/16 A, 16 R, 200/83 H, 262, 265, 292–295, 303, 307, 243; 361/751, 779, 781, 807, 808, 809; 439/59

[56] References Cited

U.S. PATENT DOCUMENTS

| | | | |
|---|---|---|---|
| 3,866,008 | 2/1975 | Teruzzi | 200/307 |
| 4,107,499 | 8/1978 | Weidler | 200/292 |
| 4,535,209 | 8/1985 | Kurz | 200/292 |
| 4,862,325 | 8/1989 | Ohashi | 361/781 |
| 4,963,002 | 10/1990 | Tagusa et al. | 350/336 |
| 5,145,057 | 9/1992 | Hirota et al. | 200/16 A |

FOREIGN PATENT DOCUMENTS

| | | | |
|---|---|---|---|
| 61-202827 | 12/1986 | Japan . | |
| 5-128937 | 5/1993 | Japan | 200/243 |

*Primary Examiner*—Donald A. Sparks
*Attorney, Agent, or Firm*—Sughrue, Mion, Zinn, Macpeak & Seas

[57] ABSTRACT

A switch is provided which is simple in constitution and can be efficiently mounted on a circuit board, and a method of efficiently mounting the switch on the board is also provided. In particular, a switch device comprises a circuit board including a conductor pattern; a fixed contact member provided on a land portion of the conductor pattern; a movable contact member movable to touch/detach with the fixed contact member; a casing for receiving the movable and fixed contact members; locking member for fitting the casing to the circuit board, the locking member being provided in the casing; a holding member for holding the movable contact member with respect to the fixed contact member in one of the touched and detached condition, the holding member being provided in the casing.

10 Claims, 3 Drawing Sheets

5,552,964

SWITCH MOUNTED ON CIRCUIT BOARD AND METHOD OF MOUNTING SWITCH ON CIRCUIT BOARD

BACKGROUND OF THE INVENTION

A switch is mounted on a circuit board having a circuit for driving a motor or the like. FIG. 7 shows such a circuit board 2 which is provided on the body 1 of a spindle motor for driving a floppy disk and has a conductor foil pattern constituting a motor drive circuit but not shown in the drawing. A motor drive circuit component 3 is provided on the circuit board 2 correspondingly to the conductor foil pattern. A push switch 4 serving as switch unit is mounted on the circuit board 2 so that the switch is in contact with the lands of the conductor foil pattern. The switch 4 is partly slidably fitted in the board 2 in order to be turned on or off so that the lands electrically connected to external terminals are electrically connected to or disconnected from each other to send out or eliminate an electric signal indicative of the loading of a medium such as a floppy disk. The circuit board 2 includes an iron plate 2a, an electrically insulating layer 2b laminated thereon, and the conductor foil pattern 5 provided on the layer and having a plurality of lines, as shown in FIGS. 8 and 9. The pattern 5 has lands 5a formed at the end portion of conductor foil pattern and opposed to each other at a predetermined distance between the lands 5a. The push switch is disposed at the distance between the lands 5.

The push switch 4 includes a case 41, a pair of fixed contact members 42, and a movable contact member 43. The fixed contact members 42 extend sideward through the wall of the case 41, and are soldered to the lands 5a of the conductor foil pattern 5 so that the fixed contact members 42 are electrically connected to the lands. The movable contact member 43 has a switching rod 43a vertically extending through the top of the case 41 above the circuit board 2, and a coil spring 43b urging the rod upward as shown in FIG. 8 so that the member is normally in pressure touch with the fixed contact members 42 to keep the switch 4 on. When the medium is loaded, the switching rod 43a is pushed in or downward as shown in FIG. 8 against the urging force of the spring 43b so that the movable contact member 43 is put out of touch with the fixed contact members 42 to turn off the switch 4. As a result, the electric signal indicative of the loading of the medium is sent out.

The circuit board 2 is passed through a reflowing furnace with the soldering operation. The push switch 4 is not resistant to heat. Since the switch 4 is manually soldered to the board 2 after the board is subjected to a reflowing process in the furnace, the efficiency of mounting of the switch on the board is low and the soldering is likely to be improperly done to deteriorate the yield of a finished product. If a push switch resistant to heat is used instead of the former, the cost of the product is increased.

SUMMARY OF THE INVENTION

The present invention was made in order to solve the problems described above. Accordingly, it is an object of the invention to provide a switch which is simple in constitution and can be efficiently mounted on a circuit board, and it is another object of the invention to provide a method of efficiently mounting the switch on the board.

According to an aspect of the present invention, there is provided a switch device which comprises a circuit board including a conductor pattern; a fixed contact member provided on a land portion of said conductor pattern; a movable contact member movable to touch/detach with said fixed contact member; a casing for receiving said movable and fixed contact members; locking member for fitting said casing to said circuit board, said locking member being provided in said casing; and a holding member for holding said movable contact member with respect to the said fixed contact member in one of the touched and detached condition, said holding member being provided in said casing.

DETAILED DESCRIPTION OF THE PREFERRED EMBODIMENTS

Figure 1:
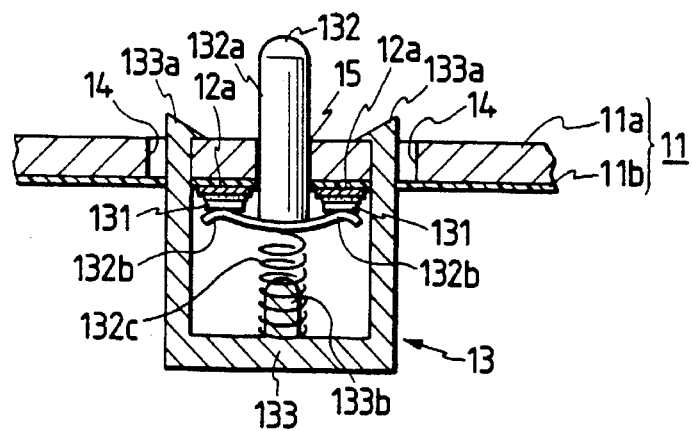
FIG. 1 is a sectional view of a switch according to a first embodiment of the present invention and is mounted on a circuit board.
Figure 2:
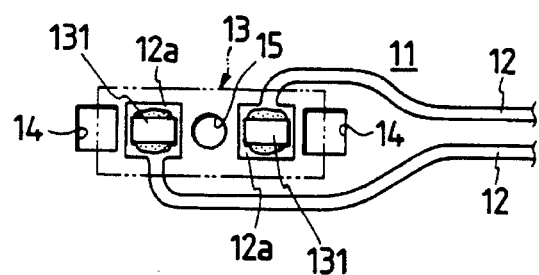
FIG. 2 is a plan view of the switch in the state that it is mounted on the board.
Figure 3:
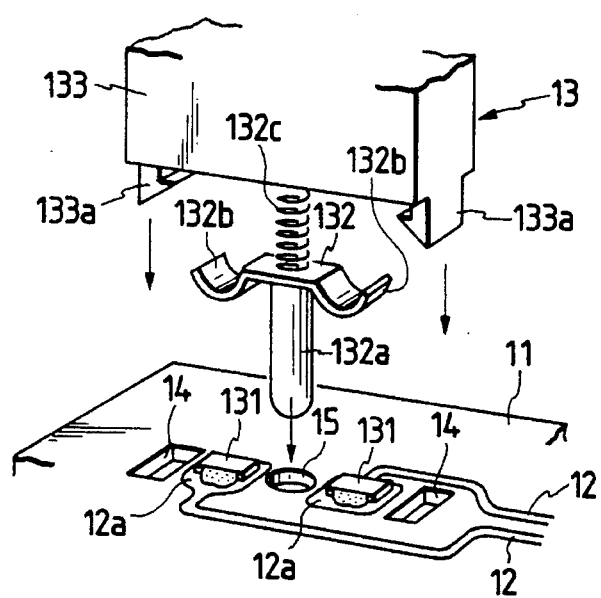
FIG. 3 is an exploded perspective view of the switch to illustrate a method which is the first embodiment of the invention and in which the switch is mounted on the board.
Figure 4:
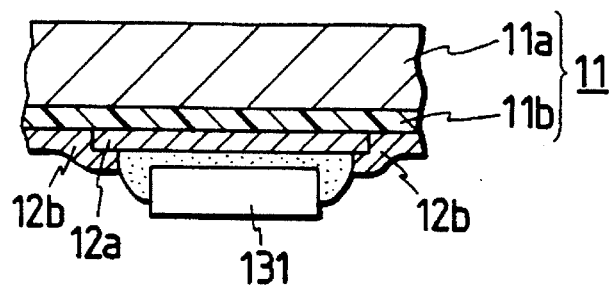
FIG. 4 is an enlarged sectional view of the fixed contact members of the switch of the first embodiment of the present invention.

Embodiments of the present invention are hereafter described with reference to the drawings attached hereto.

FIGS. 1, 2, 3 and 4 show a push switch 13 according to one of the embodiments and is mounted on a circuit board 11 in a method according to another of the embodiments. The circuit board 11 includes an iron plate 11a, an electrically insulating layer 11b provided on the iron plate 11a, and a conductor foil pattern 12 provided on the electrically insulating layer 11b and having a plurality of lines which are coated with a resist 12b for protecting the lines and have lands 12a formed at the ends of the lines but not coated with the resist, a silk printing or the like. The lands 12a are opposed to each other at a predetermined distance between them. The switch 13 is mounted on the circuit board 2 so that the switch is in touch with the lands 12a.

The constitution and operation of the push switch 13 and the method of mounting it on the circuit board 11 are described in detail from now on. The board 11 has fitting holes 14 extending through it outside a pair of the lands 12a and each having a nearly square cross section, and a switching hole 15 extending through the board between the pair of the lands and having a circular cross section.

Each of the fixed contact members 131 of the switch 13 has a nearly square cross section. The fixed contact members 131 and other circuit components are soldered to the lands 12a through reflowing, so that the members and the components are electrically connected to the lands. Dottings in FIGS. 1, 2, 3 and 4 indicate layers of solder. The switching rod 132a of the movable contact member 132 of the switch 13 is inserted into the switching hole 15. The engagement portions 133a of the case 133 of the switch 13 is thereafter fitted in the fitting holes 14 of the circuit board 11.

The movable contact member 132 includes a movable contact plate 132b extending in opposite sideward directions from the bottom of the switching rod 132a, and a coil spring 132c whose one end is in touch with the central portion of the movable contact plate 132b. Each movable contact plate 132b has respectively curved portions which are convex toward the corresponding fixed contact members 131 and put into and out of touch with them.

The tip parts of the engagement portions 133a of the case 133 are shaped as hooks to correspond to the fitting holes 14 of the circuit board 11, and engaged thereon at the edges of the fitting holes 14. The coil spring 132c is fitted around the internal boss 133b of the case 133, and urges the movable contact member 132 upward as shown in FIG. 1 so that the movable contact plate 132b is normally in pressure touch with the fixed contact members 131 to keep on the push switch 13. When a medium such as a floppy disk is loaded, the switching rod 132a of the movable contact member 132 is pushed downward as shown in FIG. 1 against the urging force of the coil spring 132c so that the movable contact plate 132b is put out of touch with the fixed contact members 131 to turn off the switch 13. As a result, an electric signal indicative of the loading of the medium is generated to detect the loading.

To mount the push switch 13 on the circuit board 11 in the method, the fixed contact members 131 of the push switch 13 are first soldered to the pair of the lands 12a of the conductor foil pattern 12 through the reflowing. At the same time, the other circuit components are also soldered to the others of the lands 12a through the reflowing. The movable contact member 132 of the switch 13 is thereafter fitted in the board 11 at the same time as the case 133 of the switch is fitted in the board by pushing the case. The switch 13 is thus mounted on the board 11 without manual soldering.

Figure 5:
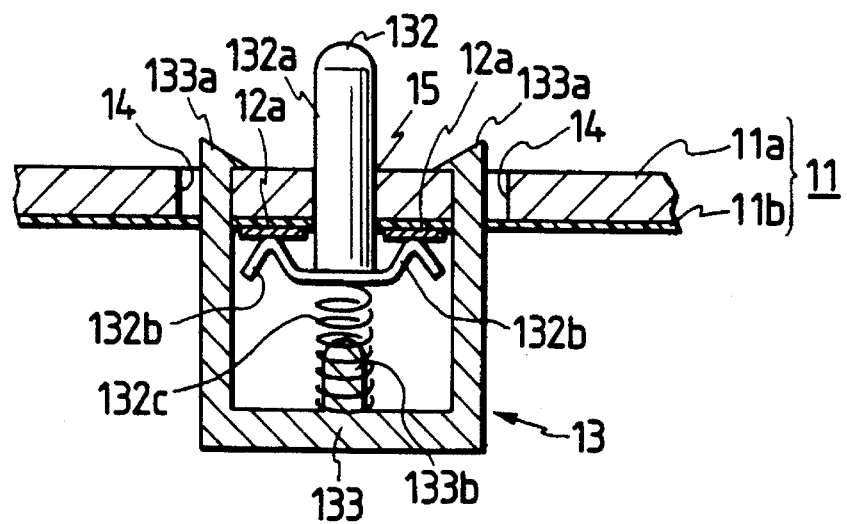
FIG. 5 is a sectional view of a switch according to a second embodiment of the invention and is mounted on a circuit board.
Figure 6:
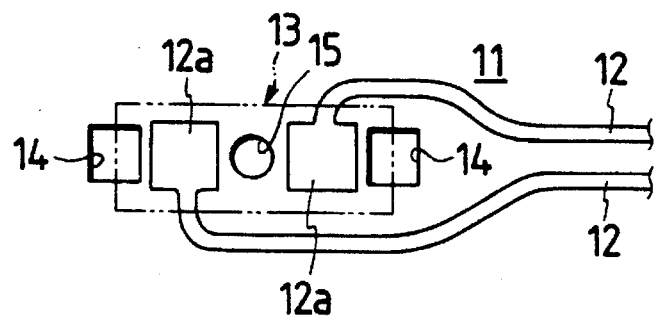
FIG. 6 is a plan view of the latter switch in the state that it is mounted on the board of the second embodiment of the present invention.
Figure 7:
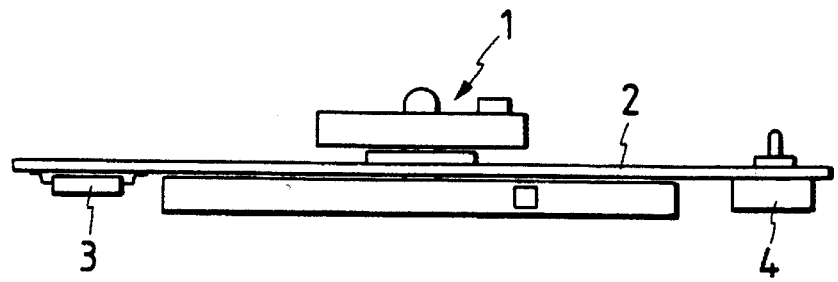
FIG. 7 is a side view of a motor provided with a conventional switch mounted on a circuit board.
Figure 8:
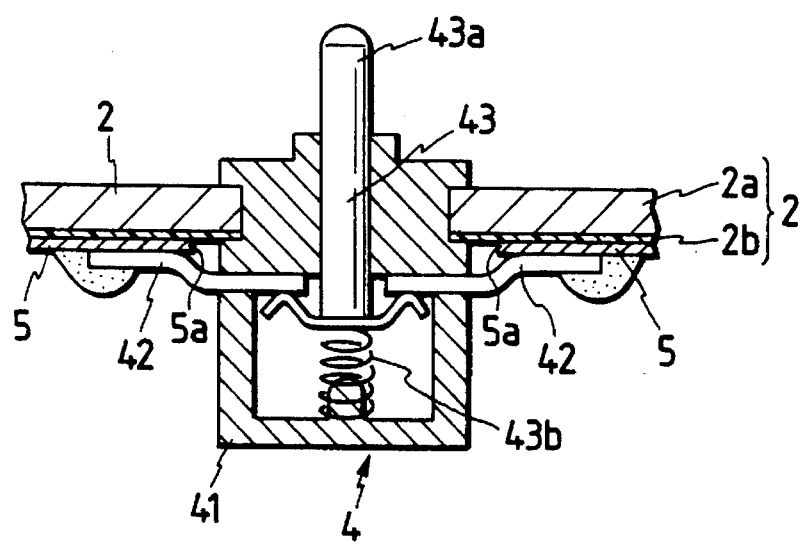
FIG. 8 is a sectional view of the conventional switch in the state that it is mounted on the board.
Figure 9:
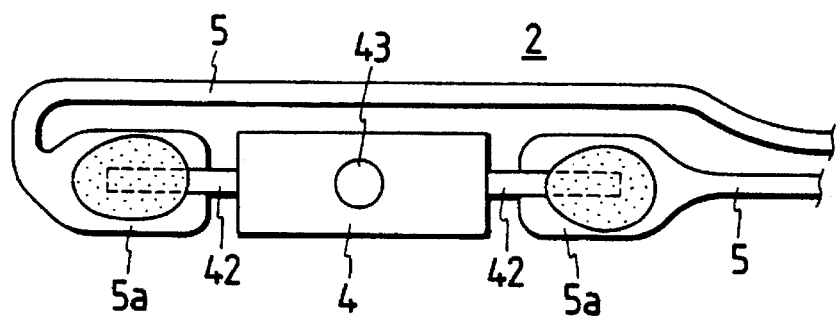
FIG. 9 is a plan view of the conventional switch in the state that it is mounted on the board.

FIGS. 5 and 6 show a push switch 13 according to the second embodiment of the present invention. The same numerals in FIGS. 1, 2, 3, 4, 5 and 6 denote equivalents. The difference of the push switch 13 from the preceding one is that a pair of the lands 12a of the conductor foil pattern 12 of a circuit board 11, on which the switch is mounted, constitute the fixed contact members of the switch. Until the mounting, the lands 12a are protected by taping thereon or the like. It is preferable that the surfaces of the lands 12a are subjected to a treatment such as solder plating and gold plating, to always serve as stable switching contacts.

The movable contact member 132 of the switch 13 includes a switching rod 132a, a movable contact plate 132b extending in opposite sideward directions from the bottom of the rod, and a helical spring 132c whose one end is in touch with the central portion of the plate. The movable contact plate 132b has curved portions which are convex toward the corresponding lands 12a of the conductor foil pattern 12 and put into an out of touch with the lands so that they serve as the fixed contact members of the switch 13.

The tip parts of the engagement portions 133a of the case 133 of the push switch 13 are shaped as hooks to correspond to the fitting holes 14 of the circuit board 11, and fitted in the board at the edges of the holes 14. The coil spring 132c is fitted around the internal boss 133b of the case 133, and urges the movable contact member 132 upward as shown in FIG. 5 so that the movable contact plate 132b is normally in pressure touch with the pair of the lands 12a as the fixed contact members of the switch 13 to keep it on. When a medium such as a floppy disk is loaded, the switching rod 132a of the movable contact member 132 is pushed in or downward as shown in FIG. 5 against the urging force of the spring 132c so that the movable contact plate 132b is put out of touch with the pair of the lands 12a to turn off the switch 13. As a result, an electric signal indicative of the loading of the medium is generated to detect the loading.

According to the first and second embodiments of the present invention, since the pair of the lands 12a of the conductor foil pattern 12 constitute the fixed contact members of the push switch 13, with which the movable contact member 132 thereof is put into and out of touch, and the movable contact member 132 is fitted in the circuit board 11 at the same time as the case 133 of the switch is fitted in the board by pushing the case, the switch is mounted on the board without soldering operation. Since the pair of the lands 12a are located inside the case 133, the disposition space for the switch 13 is reduced to decrease the size and thickness of the switch and the constitution thereof is simplified. Moreover, in order to decrease the size and thickness of the switch and the constitution thereof, the fixed contact members are formed by the foil conductor such as an electrically conductive adhesive or the like.

Although each of the push switches 13 of the first and second embodiments is turned on when being pushed, the present invention may also be embodied as a push switch which is turned off when being pushed, and as various non-push switches. Each of the circuit boards 11, on which the push switches 13 are mounted, may be attached to various things such as a spindle motor for driving a floppy disk. Besides, each of the push switched 13 may be mounted on either of the obverse and reverse sides of the circuit board 11.

According to the present invention, not only the fixed contact members of a switch but also other circuit components are simultaneously soldered to the lands of the conductor foil pattern of a circuit board through reflowing, and the movable contact member of the switch is thereafter fitted in the board, so that the switch is mounted on the board. Since the switch is thus mounted on the circuit board without manual soldering, the mounting is simple, easy and secure and productivity is enhanced.

Also according to the present invention, the fixed contact members of a switch, with which the movable contact member thereof is put into and out of touch, are constituted by the lands of the conductor foil pattern of a circuit board, and the movable contact member is fitted in the board, so that the switch is mounted on the board. Since the switch is thus mounted on the circuit board without soldering the fixed contact member thereto, the mounting is simple, easy and secure and productivity is enhanced.

What is claimed is:

1. A switch device comprising:

a circuit board including a conductor pattern having a land portion;

a fixed contact member electrically provided on said land portion of said conductor pattern and having a fixed contact, said fixed contact member being reflow-soldered to said land portion;

a movable contact member having a movable contact movable to touch/detach with said fixed contact of said fixed contact member;

a casing for receiving therein said land portion of said conductor pattern and said movable and fixed contact members, said movable contact member, said land portion, and said fixed contact member which is reflow-soldered to said land portion, all being completely enclosed within said casing;

a locking member for fitting said casing to said circuit board, said locking member being provided in said casing; and a holding member for holding said movable contact with respect to said fixed contact in one of a touched and a detached condition, said holding member being provided in said casing.

2. A switch device as claimed in claim 1, wherein said movable contact member contains an operation member protruding from said circuit board and a contact member which is contacted with said fixed contact member.

3. A switch device as claimed in claim 1, wherein said land portion of said conductor pattern corresponds to said fixed contact member.

4. A switch device as claimed in claim 1, wherein said fixed contact member is electrically conductive adhesive.

5. A switch device comprising:

a circuit board including a conductor pattern;

a fixed contact member electrically provided on a land portion of said conductor pattern and having a fixed contact, said fixed contact member being reflow-soldered to said land portion;

a movable contact member having a movable contact movable to touch/detach with said fixed contact of said fixed contact member;

a casing for receiving therein said movable and fixed contact members, said movable contact member and said fixed contact member being completely enclosed within said casing;

a locking member for fitting said casing to said circuit board, said locking member being provided in said casing;

an assembling member provided in said casing; and an elastic member having one end thereof fixed to said assembling member and the other end thereof secured to said movable contact member to urge said movable contact member against said circuit board so as to one of touch and detach said movable contact of said movable contact member with said fixed contact member.

6. A switch device as claimed in claim 5, wherein said movable contact member contains an operation member protruding from said circuit board and a contact member which is contacted with said fixed contact member.

7. A switch device as claimed in claim 5, wherein said land portion of said conductor pattern corresponds to said fixed contact member.

8. A switch device as claimed in claim 5, wherein said fixed contact member is electrically conductive adhesive.

9. A switch device comprising:

a circuit board including a conductor pattern;

a fixed contact member reflow soldered on a land portion of said conductor pattern, said fixed contact member being electrically conductive adhesive;

a movable contact member movable to touch/detach with said fixed contact member;

a casing for receiving said movable and fixed contact members;

a locking member for fitting said casing to said circuit board, said locking member being provided in said casing; and a holding member for holding said movable contact member with respect to said fixed contact member in one of a touched and a detached condition, said holding member being provided in said casing.

10. A switch device comprising:

a circuit board including a conductor pattern;

a fixed contact member reflow soldered on a land portion of said conductor pattern, said fixed contact member being electrically conductive adhesive;

a movable contact member movable to touch/detach with said fixed contact member;

a casing for receiving said movable and fixed contact members;

a locking member for fitting said casing to said circuit board, said locking member being provided in said casing;

an assembling member provided in said casing; and an elastic member having one end thereof fixed to said assembling member and the other end thereof secured to said movable contact member to urge said movable contact member against said circuit board so as to one of touch and detach said movable contact member with said fixed contact member.

* * * * *